(12) United States Patent
Luo

(10) Patent No.: US 12,004,374 B2
(45) Date of Patent: Jun. 4, 2024

(54) DISPLAY PANEL, MANUFACTURING METHOD THEREOF, AND DISPLAY DEVICE

(71) Applicant: Shenzhen China Star Optoelectronics Semiconductor Display Technology Co., Ltd., Guangdong (CN)

(72) Inventor: Chuanbao Luo, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/438,999

(22) PCT Filed: Jul. 26, 2021

(86) PCT No.: PCT/CN2021/108400
§ 371 (c)(1),
(2) Date: Sep. 14, 2021

(87) PCT Pub. No.: WO2023/000352
PCT Pub. Date: Jan. 26, 2023

(65) Prior Publication Data
US 2024/0032337 A1    Jan. 25, 2024

(30) Foreign Application Priority Data
Jul. 20, 2021 (CN) .......................... 202110818578.8

(51) Int. Cl.
H01L 21/00 (2006.01)
G02F 1/1362 (2006.01)
(Continued)

(52) U.S. Cl.
CPC ... H10K 59/1213 (2023.02); G02F 1/136209 (2013.01); G02F 1/1368 (2013.01); H10K 59/1201 (2023.02); H10K 59/65 (2023.02)

(58) Field of Classification Search
CPC .. G02F 1/1368; H10K 59/65; H10K 59/1201; H10K 59/1213
See application file for complete search history.

(56) References Cited

U.S. PATENT DOCUMENTS 11,315,460 B1 *  4/2022  Xue ......................... G09G 3/20
2011/0272689 A1  11/2011  Park et al.
(Continued)

FOREIGN PATENT DOCUMENTS

CN          105373772          3/2016
CN          109800623          5/2019
(Continued)

*Primary Examiner* — Douglas M Menz

(57) ABSTRACT

A display panel, a manufacturing method thereof, and a display device are provided. Through a configuration of a capacitor in the display panel, where the capacitor is connected to a first thin film transistor, a photosensitive pattern in the capacitor senses light, such that when the light varies, a varying charge quantity of the photosensitive pattern in the capacitor varies current of the first thin film transistor, increasing a sensitometric characteristic of the first thin film transistor, and increasing fingerprint recognition effect, and a second gate is configured to be a capacitor polar plate, decreasing a thickness of an array substrate.

20 Claims, 9 Drawing Sheets

(51) Int. Cl.
  *G02F 1/1368* (2006.01)
  *H10K 59/12* (2023.01)
  *H10K 59/121* (2023.01)
  *H10K 59/65* (2023.01)

(56) References Cited

U.S. PATENT DOCUMENTS

2012/0327032 A1    12/2012  Jeon et al.
2022/0109005 A1*    4/2022  Liu .................... H01L 27/124

FOREIGN PATENT DOCUMENTS

| CN | 110291418 | 9/2019 |
| CN | 112511769 | 3/2021 |
| CN | 113130602 | 7/2021 |

* cited by examiner

DISPLAY PANEL, MANUFACTURING METHOD THEREOF, AND DISPLAY DEVICE

RELATED APPLICATIONS

This application is a National Phase of PCT Patent Application No. PCT/CN2021/108400 having International filing date of Jul. 26, 2021, which claims the benefit of priority of Chinese Patent Application No. 202110818578.8 filed on Jul. 20, 2021. The contents of the above applications are all incorporated by reference as if fully set forth herein in their entirety.

FIELD AND BACKGROUND OF THE INVENTION

The present application relates to the field of display technology, and especially to an organic light-emitting diode (OLED) display panel and an OLED display device.

In order to increase a screen-to-body ratio of display devices, a fingerprint sensor is disposed under a display screen. Because oxide thin film transistors have higher electron mobility and stability in comparison with amorphous silicon thin film transistors, conventional fingerprint sensors adopt oxide thin film transistors, such as indium gallium zinc oxide (IGZO) thin film transistors. However, because IGZO thin film transistors have higher bandwidth, they only absorb ultraviolet light with shorter wavelengths. According to tests of oxide thin film transistors, their leakage currents have significant response to light with wavelengths shorter than 468 nanometers. However, for visible light with wavelengths from 400 nanometers to 760 nanometers, there are a great quantity of visible light which oxide thin film transistors cannot sense, and therefore fingerprint sensors with IGZO thin film transistors cannot sense where a finger taps, leading to worse fingerprint recognition effect.

Therefore, there is a technical problem that narrower sensitivity ranges of oxide thin film transistors lead to worse recognition effect of fingerprint sensors in conventional display devices.

SUMMARY OF THE INVENTION

Embodiments of the present application provide a display panel, a manufacturing method thereof, and a display device to solve the technical problem that narrower sensitivity ranges of oxide thin film transistors lead to worse recognition effect of fingerprint sensors in conventional display devices.

In order to solve the above-mentioned problem, the present application provides a technical approach as follows:

Embodiments of the present application provide a display panel that includes an array substrate, and the array substrate includes:

A substrate;
A first gate disposed on one side of the substrate;
An active pattern disposed on one side of the first gate away from the substrate;
  A second gate disposed on one side of the active pattern away from the first gate;
  A photosensitive pattern disposed on one side of the second gate away from the active pattern; and
  A polar plate disposed on one side of the photosensitive pattern away from the second gate;
Wherein the array substrate further includes a first source and a first drain, the first gate, the first source, the first drain, the second gate, and the active pattern form a first thin film transistor, and the second gate, the photosensitive pattern, and the polar plate form a capacitor.

In some embodiments, the first gate is disposed in a same layer as the first source, the first gate is disposed insulated from the first source, the first gate is disposed in the same layer as the first drain, and the first gate is disposed insulated from the first drain.

In some embodiments, the array substrate further includes a second source, a third gate, and a first shading pattern, the second source, the first drain, the third gate, and the active pattern form a second thin film transistor, the first shading pattern is disposed corresponding to the active pattern of the second thin film transistor, the first shading pattern is disposed in the same layer as the first gate, the first source, and the first drain, and the first shading pattern is disposed insulated from the first gate, the first source, and the first drain.

In some embodiments, the array substrate further includes a pixel electrode layer disposed on one side of the photosensitive pattern away from the second gate, the pixel electrode layer includes a pixel electrode and a polar plate, and the polar plate is insulated from the pixel electrode.

In some embodiments, the array substrate further includes a transparent conductive layer and a pixel electrode layer, the transparent conductive layer is disposed between the pixel electrode layer and the photosensitive pattern, the transparent conductive layer forms a polar plate, and the polar plate is disposed insulated from the pixel electrode layer.

In some embodiments, the array substrate further includes a second shading pattern correspondingly disposed on the second thin film transistor.

In some embodiments, the second gate is disposed in a same layer as the third gate.

In some embodiments, a material of the photosensitive pattern includes at least one of amorphous silicon or thiophene organic materials.

In some embodiments, the array substrate further includes:
  A shading layer disposed on one side of the substrate and forming a first shading pattern;
  A buffer layer disposed on one side of the shading layer away from the substrate; and
  A metal layer forming the first gate, the first source, and the first drain.

In some embodiments, the array substrate further includes:
  A shading layer disposed on one side of the substrate and forming a first shading pattern;
  A buffer layer disposed on one side of the shading layer away from the substrate;
  A first metal layer disposed on one side of the buffer layer away from the shading layer;
  A first gate insulation layer disposed on one side of the first metal layer away from the buffer layer;
  An active layer disposed on one side of the first gate insulation layer away from the first metal layer;
  A second gate insulation layer disposed on one side of the active layer away from the first metal layer; and
  A second metal layer disposed on one side of the second gate insulation layer away from the active layer and forming the second gate;
  Wherein the first metal layer forms the first gate, the first source, and the first drain.

Meanwhile, embodiments of the present application provide a display device that includes a display panel and electronic components, the display panel includes an array substrate, and the array substrate includes:

A substrate;

A first gate disposed on one side of the substrate;

An active pattern disposed on one side of the first gate away from the substrate;

A second gate disposed on one side of the active pattern away from the first gate;

A photosensitive pattern disposed on one side of the second gate away from the active pattern; and A polar plate disposed on one side of the photosensitive pattern away from the second gate;

Wherein the array substrate further includes a first source and a first drain, the first gate, the first source, the first drain, the second gate, and the active pattern form a first thin film transistor, and the second gate, the photosensitive pattern, and the polar plate form a capacitor.

In some embodiments, the electronic components include an under-screen camera.

In some embodiments, the display panel includes a liquid crystal display panel or an organic light-emitting diode (OLED) display panel.

In some embodiments, the first gate is disposed in a same layer as the first source, the first gate is disposed insulated from the first source, the first gate is disposed in the same layer as the first drain, and the first gate is disposed insulated from the first drain.

In some embodiments, the array substrate further includes a second source, a third gate, and a first shading pattern, the second source, the first drain, the third gate, and the active pattern form a second thin film transistor, the first shading pattern is disposed corresponding to the active pattern of the second thin film transistor, the first shading pattern is disposed in the same layer as the first gate, the first source, and the first drain, and the first shading pattern is disposed insulated from the first gate, the first source, and the first drain.

In some embodiments, the array substrate further includes a pixel electrode layer disposed on one side of the photosensitive pattern away from the second gate, the pixel electrode layer includes a pixel electrode and a polar plate, and the polar plate is insulated from the pixel electrode.

In some embodiments, the array substrate further includes a transparent conductive layer and a pixel electrode layer, the transparent conductive layer is disposed between the pixel electrode layer and the photosensitive pattern, the transparent conductive layer forms a polar plate, and the polar plate is disposed insulated from the pixel electrode layer.

In some embodiments, the array substrate further includes a second shading pattern correspondingly disposed on the second thin film transistor.

In some embodiments, the second gate is disposed in a same layer as the third gate.

Meanwhile, embodiments of the present application provide a manufacturing method of a display panel that includes:

Providing a substrate;

Forming a first metal layer on the substrate and processing the first metal layer to form a first gate, a first source, a first drain, a second source, and a second drain;

Forming a second gate on one side of the first metal layer away from the substrate;

Forming a photosensitive pattern on one side of the second gate away from the first metal layer; and Forming a polar plate on one side of the photosensitive pattern away from the second gate; wherein the first gate, the first source, the second gate, and an active pattern form a first thin film transistor, and the second gate, the photosensitive pattern, and the polar plate form a capacitor.

The present application provides a display panel, a manufacturing method thereof, and a display device. An array substrate includes a substrate, a first gate, an active pattern, a second gate, a photosensitive pattern, and a polar plate. The first gate is disposed on one side of the substrate, the active pattern is disposed on one side of the first gate away from the substrate, the second gate is disposed on one side of the active pattern away from the first gate, the photosensitive pattern is disposed on one side of the second gate away from the active pattern, and the polar plate is disposed on one side of the photosensitive pattern away from the second gate, wherein the array substrate further includes a first source and a first drain, the first gate, the first source, the first drain, the second gate, and the active pattern form a first thin film transistor, and the second gate, the photosensitive pattern, and the polar plate form a capacitor. In the present application, through a configuration of the capacitor in the array substrate, where the capacitor is connected to the first thin film transistor, the photosensitive pattern in the capacitor senses light, such that when the light varies, a varying charge quantity of the photosensitive pattern in the capacitor varies current of the first thin film transistor. A sensitometric characteristic of the photosensitive pattern is better than a sensitometric characteristic of an active pattern of a thin film transistor, thereby increasing a sensitometric characteristic of the first thin film transistor, and increasing fingerprint recognition effect, and the second gate is configured to be a capacitor polar plate, decreasing a thickness of the array substrate.

BRIEF DESCRIPTION OF THE SEVERAL VIEWS OF THE DRAWINGS

With reference to the following drawings, the technical approach and other beneficial effects of the present application will be obvious through describing embodiments of the present application in detail.

DESCRIPTION OF SPECIFIC EMBODIMENTS OF THE INVENTION

For better clearness and definiteness of purpose, technical approach, and effect of the present application, the following further describes embodiments of the present application in detail with reference to accompanying drawings. It should be understood that the embodiments described here is merely for explaining the present application and not intended to limit the present application.

Embodiments of the present application are directed to a technical problem that narrower sensitivity ranges of oxide thin film transistors lead to worse recognition effect of fingerprint sensors in conventional display devices, and provide an array substrate, a manufacturing method thereof, and a display panel to solve the above-mentioned technical problem.

Figure 1:
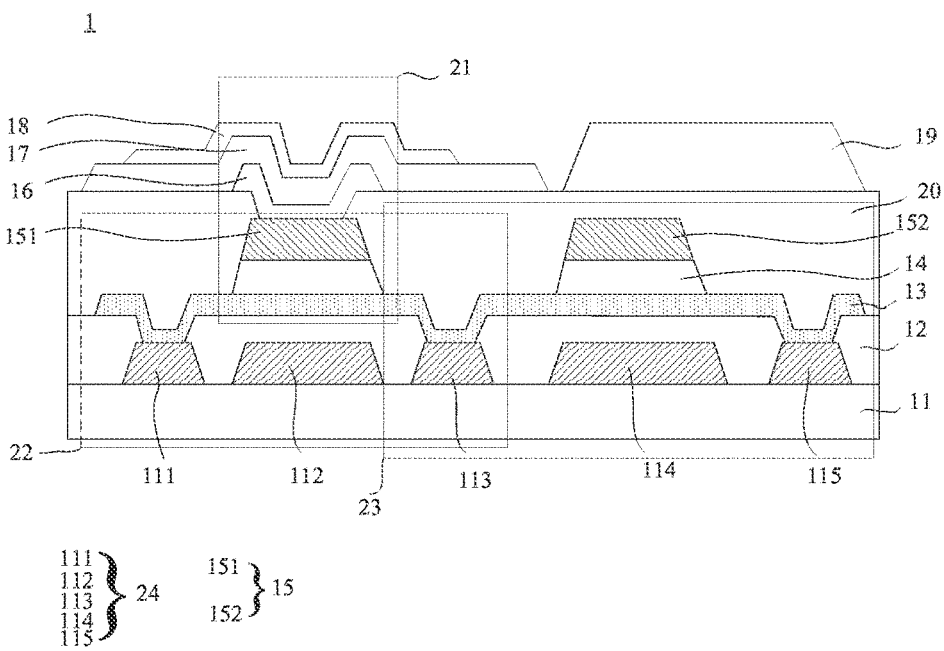
FIG. 1 is a first schematic diagram of a display panel according to embodiments of the present application.

As shown in FIG. 1, embodiments of the present application provide a display panel 1, and the display panel 1 includes an array substrate that includes:

A substrate 11;
A first gate 112 disposed on one side of the substrate 11;
An active pattern 13 disposed on one side of the first gate 112 away from the substrate 11;
A second gate 151 disposed on one side of the active pattern 13 away from the first gate 112;
A photosensitive pattern 16 disposed on one side of the second gate 151 away from the active pattern 13; and
A polar plate 181 disposed on one side of the photosensitive pattern 16 away from the second gate 151;
Wherein, the array substrate further includes a first source 111 and a first drain 113, the first gate 112, the first source 111, the first drain 113, the second gate 151, and the active pattern 13 form a first thin film transistor 22, and the second gate 151, the photosensitive pattern 16, and the polar plate 181 form a capacitor 21.

Embodiments of the present application provide the display panel that includes the array substrate. Through a configuration of the capacitor in the array substrate, where the capacitor is connected to the first thin film transistor, the photosensitive pattern in the capacitor senses light, such that when the light varies, a varying charge quantity of the photosensitive pattern in the capacitor varies current of the first thin film transistor. A sensitometric characteristic of the photosensitive pattern is better than a sensitometric characteristic of an active pattern of a thin film transistor, thereby increasing a sensitometric characteristic of the first thin film transistor, and increasing fingerprint recognition effect, and the second gate is configured to be a capacitor polar plate, decreasing a thickness of the array substrate.

When a source/drain is disposed in a different layer from a gate in a thin film transistor, a thickness of an array substrate would be greater, and manufacturing processes of the array substrate are more complicated. In one embodiment, the first gate is disposed in a same layer as the first source, the first gate is disposed insulated from the first source, the first gate is disposed in the same layer as the first drain, and the first gate is disposed insulated from the first drain. Through disposing the first gate in a same layer as the first source and the first drain, it does not need a configuration of two metal layers separately forming the first gate, the first source, and the first drain, decreasing a thickness of the array substrate, and because the first gate is disposed in the same layer as the first source and the first drain, it does not need several masks to form metal layers and vias, decreasing complexity of manufacturing processes of the array substrate.

In one embodiment, as shown in FIG. 1, the array substrate further includes a second source 115, a third gate 152, and a first shading pattern 114. The second source 115, the first drain 113, the third gate 152, and the active pattern 13 form a second thin film transistor 23, the first shading pattern 114 is disposed corresponding to the active pattern 13 of the second thin film transistor 23, the first shading pattern 114 is disposed in the same layer as the first gate 112, the first source 111, and the first drain 113, and the first shading pattern 114 is disposed insulated from the first gate, the first source, and the first drain. Through disposing the first shading pattern in the same layer as the first source, the first drain, and the first gate, it needs only one metal layer, rather than separately forming a metal layer corresponding to the first shading pattern, a metal layer corresponding to the first gate, a metal layer corresponding to the first source and the first drain, and insulation layers between metal layers, decreasing a thickness of the display panel, and during a process of forming the metal layer, it does not need several masks to form various metal layers and insulation layers, simplifying manufacturing processes of the display panel. Through using the first drain of the first thin film transistor as the second drain of the second thin film transistor, the sources/drains of the first thin film transistor and the second thin film transistor are disposed in a same layer, decreasing the thickness of the array substrate, and sharing of the first drain of the first thin film transistor and the second drain of the second thin film transistor decreases occupied areas of the first thin film transistor and the second thin film transistor, increasing a display area of the array substrate, correspondingly increasing resolution or brightness of the display panel, and increasing display effect of the display panel. Disposing the first shading pattern corresponding to the third gate prevents external light from affecting the thin film transistors.

In embodiments of the present application, through using the second gate of the first thin film transistor as a polar plate of the capacitor, a direct control of the first thin film transistor can be realized. Meanwhile, an adoption of a transparent conductive layer or a pixel electrode layer at an upper portion to form another polar plate of the capacitor decreases coupling effects between the capacitor and other capacitors of the array substrate, increasing a signal-to-noise ratio of a fingerprint sensor, and increasing fingerprint recognition effect.

In embodiments of the present application, an active pattern of the first thin film transistor is connected to an active pattern of the second thin film transistor. When the first drain of the first thin film transistor is shared by the second source of the second thin film transistor, the active pattern of the first thin film transistor is connected to the active pattern of the second thin film transistor, realizing a series connection of the first thin film transistor and the second thin film transistor, such that current can be output through the first thin film transistor and the second thin film transistor, realizing fingerprint recognition function.

Figure 3:
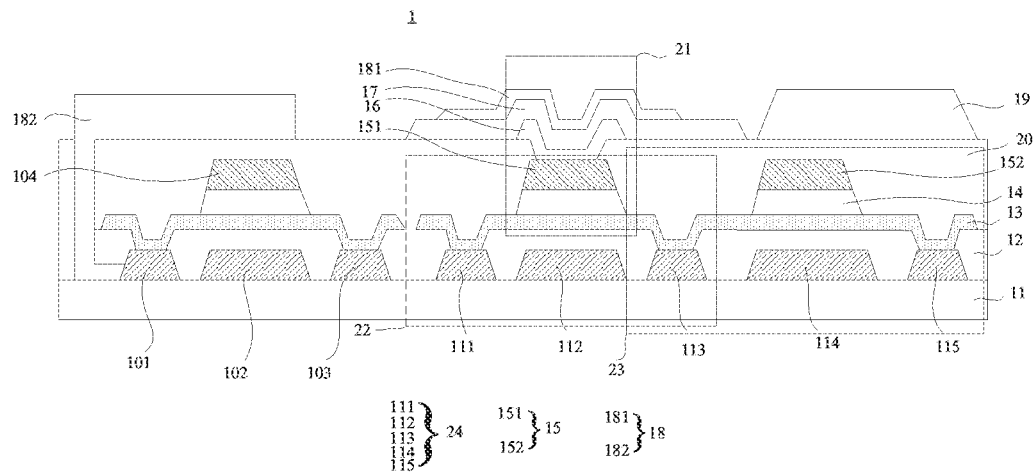
FIG. 3 is a second schematic diagram of the display panel according to embodiments of the present application.

Regarding the problem of a lower signal-to-noise ratio of a fingerprint sensor and worse effect of fingerprint recognition function. In one embodiment, as shown in FIG. 3, the array substrate further includes a pixel electrode layer 18 disposed on one side of the photosensitive pattern 16 away from the second gate, the pixel electrode layer 18 includes a pixel electrode 182 and a polar plate 181, and the polar plate 181 is insulated from the pixel electrode 182. Through using the pixel electrode layer as a polar plate of the capacitor, when irradiation varies, capacitance of the capacitor can correspondingly vary according to variation of the irradiation, and therefore current of the first thin film transistor varies, thereby realizing fingerprint recognition function.

Specifically, regarding the pixel electrode layer forming the pixel electrode and the polar plate, a photosensitive pattern corresponding to a pixel electrode area can be etched after forming the photosensitive pattern and a second passivation layer, thereby, after forming the pixel electrode layer, the pixel electrode is disposed on a first passivation layer, and the polar plate is disposed on the second passivation layer. Therefore, a same film layer is used to separately form the pixel electrode and the polar plate, reducing manufacturing processes of the display panel, and decreasing the thickness of the display panel.

Figure 4:
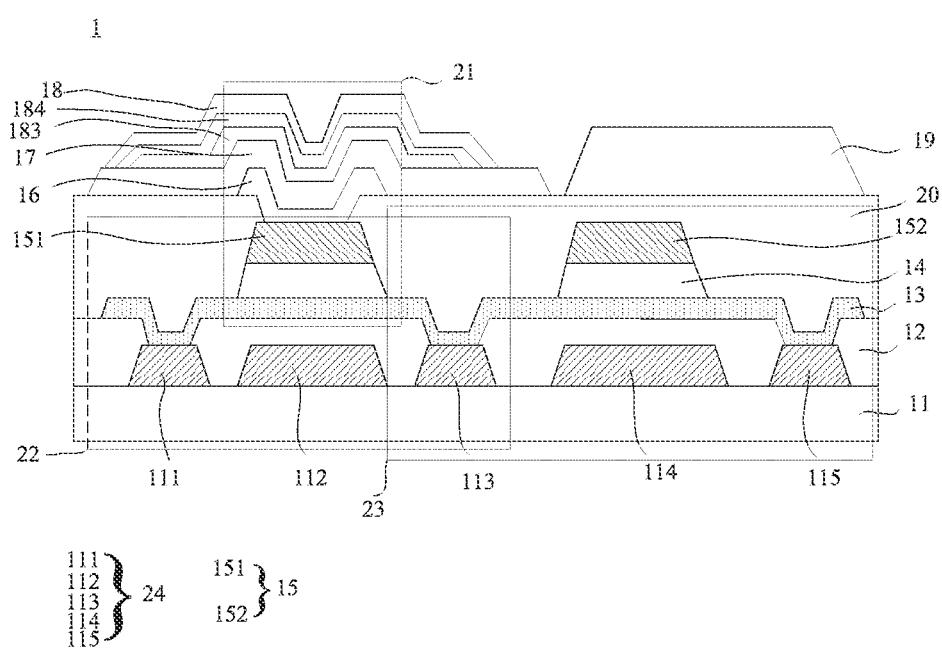
FIG. 4 is a third schematic diagram of the display panel according to embodiments of the present application.

In one embodiment, as shown in FIG. 4, the array substrate further includes a transparent conductive layer 183 and a pixel electrode layer 18, the transparent conductive layer 183 is disposed between the pixel electrode layer 18 and the photosensitive pattern 16, the transparent conductive layer 183 forms a polar plate, and the polar plate is disposed insulated from the pixel electrode layer 18. When disposing a polar plate, a transparent conductive layer can also be disposed in the array substrate to form the polar plate, preventing the polar plate from affecting a pixel electrode layer configuration.

Specifically, as shown in FIG. 4, a third passivation layer 184 is disposed between the transparent conductive layer 183 and the pixel electrode layer 18 to insulate the transparent conductive layer from the pixel electrode layer.

Specifically, as shown in FIG. 3, the display panel further includes a third source 101, a third drain 103, a fourth gate 102, and a fifth gate 104, the third source 101, the third drain 103, the fourth gate 102, the fifth gate 104, and the active pattern form a third thin film transistor, the third source 101 is connected to the pixel electrode 182, and the third thin film transistor is configured to drive an organic light-emitting device to emit light.

In one embodiment, the second gate is disposed in a same layer as the third gate. Through disposing the third gate in the same layer as the second gate, it does not need to separately dispose a metal layer corresponding to the second gate and a metal layer corresponding to the third gate, decreasing the thickness of the array substrate.

Regarding the problem that when a non-photosensitive thin film transistor is irradiated by light, performance of the thin film transistor varies. In one embodiment, as shown in FIG. 1, the array substrate further includes a second shading pattern 19 correspondingly disposed on the second thin film transistor 23. Through disposing the second shading pattern on the second thin film transistor, the second shading pattern blocks external light, preventing the external light from affecting the second thin film transistor and leading to worse fingerprint recognition effect.

Figure 2:
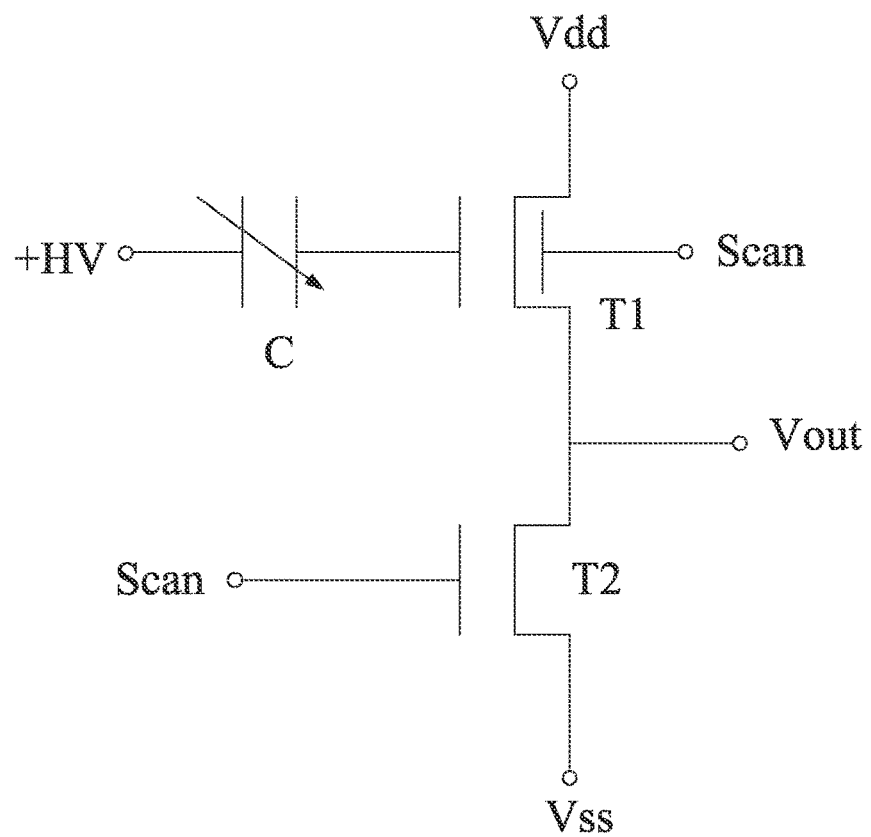
FIG. 2 is a circuit diagram of the display panel according to embodiments of the present application.

As shown in FIG. 2, using a partial circuit diagram of the array substrate to illustrate an operation process of a fingerprint sensor. A high potential voltage terminal +HV shows that a capacitor C varies when irradiation varies, that is, voltage of the high potential voltage terminal +HV varies when irradiation varies. One terminal of the capacitor C is connected to the high potential voltage terminal +HV, other terminal of the capacitor C is connected to a second gate of a first thin film transistor T1, a first gate of the first thin film transistor T1 is connected to a scan line Scan, a first source of the first thin film transistor T1 is connected to a first power terminal Vdd, a first drain of the first thin film transistor T1 is connected to a second source of a second thin film transistor T2, the first drain of the first thin film transistor T1 is connected to a voltage output terminal Vout, a second drain of the second thin film transistor T2 is connected to a second power terminal Vss, and a third gate of the second thin film transistor T2 is connected to the scan line.

When irradiation varies, a charge quantity of the capacitor C varies, and therefore current of the first thin film transistor T1 varies, potential of the voltage output terminal Vout varying, realizing fingerprint recognition function. Because a sensitivity range of a photosensitive pattern is wider than a sensitivity range of an active pattern of the first thin film transistor, fingerprint recognition effect is increased.

In one embodiment, the array substrate further includes:
A shading layer disposed on one side of the substrate and forming a first shading pattern;
A buffer layer disposed on one side of the shading layer away from the substrate; and
A metal layer forming the first gate, the first source, and the first drain.

In one embodiment, the array substrate further includes:
A shading layer disposed on one side of the substrate and forming a first shading pattern;
A buffer layer disposed on one side of the shading layer away from the substrate;
A first metal layer disposed on one side of the buffer layer away from the shading layer;
A first gate insulation layer disposed on one side of the first metal layer away from the buffer layer;
An active layer disposed on one side of the first gate insulation layer away from the first metal layer;
A second gate insulation layer disposed on one side of the active layer away from the first metal layer; and
A second metal layer disposed on one side of the second gate insulation layer away from the active layer and forming the second gate;
Wherein the first metal layer forms the first gate, the first source, and the first drain. Using the first metal layer to from the first gate, the first source, and the first drain decreases the thickness of the array substrate, and because the first gate, the first source, and the first drain are disposed in a different layer from the first shading pattern, an area of thin film transistors in the array substrate can be decreased.

The above-mentioned embodiment describes in detail a contact of the source/drain and a bottom of the active layer. In one embodiment, the second gate is disposed in a same layer as the first source, the second gate is disposed insulated from the first source, the second gate is disposed in a same layer as the first drain, and the second gate is disposed insulated from the first drain. Through disposing the first source and the first drain in the same layer as the second gate, the source/drain is in contact with a top of the active layer, and the first source and the first drain disposing in the same layer as the second gate can decrease the thickness of the array substrate.

In one embodiment, a material of the photosensitive pattern includes at least one of amorphous silicon or thiophene organic materials. Because amorphous silicon or thiophene organic materials have wider sensitivity ranges and can sense various visible light, the capacitor, the first thin film transistor, and the second thin film transistor together realize a fingerprint recognition function, increasing recognition effect of a fingerprint sensor.

In one embodiment, as shown in FIG. 1, the array substrate further includes a buffer layer 12 disposed on one side of the shading layer 24 away from the substrate 11.

In one embodiment, as shown in FIG. 1, the array substrate further includes a gate insulation layer 14 disposed on one side of the active pattern 13 away from the buffer layer 12.

In one embodiment, as shown in FIG. 1, the array substrate further includes a gate layer 15 disposed on one side of the gate insulation layer 14 away from the active pattern 13 and patterned to form a second gate 151 and a third gate 152.

In one embodiment, as shown in FIG. 1, the array substrate further includes a first passivation layer 20 disposed on one side of the gate layer 15 away from the gate insulation layer 14.

In one embodiment, as shown in FIG. 1, the array substrate further includes a second passivation layer 17 disposed on one side of the photosensitive pattern 16 away from the first passivation layer 20.

In one embodiment, a material of the shading layer includes one of molybdenum and molybdenum and copper stacking layers.

In one embodiment, a material of the buffer layer includes one of silica and silicon nitride/silica stacking layers.

In one embodiment, a material of the active layer includes one of indium gallium zinc oxide, indium gallium zinc tin oxide, and indium gallium tin oxide.

In one embodiment, a material of the first passivation layer includes silica and silica/silicon nitride stacking layers.

In one embodiment, a material of the second passivation layer includes one of silica, silica/silicon nitride stacking layers, and silica/silicon nitride/alumina stacking layers.

In one embodiment, a material of the transparent conductive layer includes one of indium tin oxide and indium zinc oxide.

Figure 5:
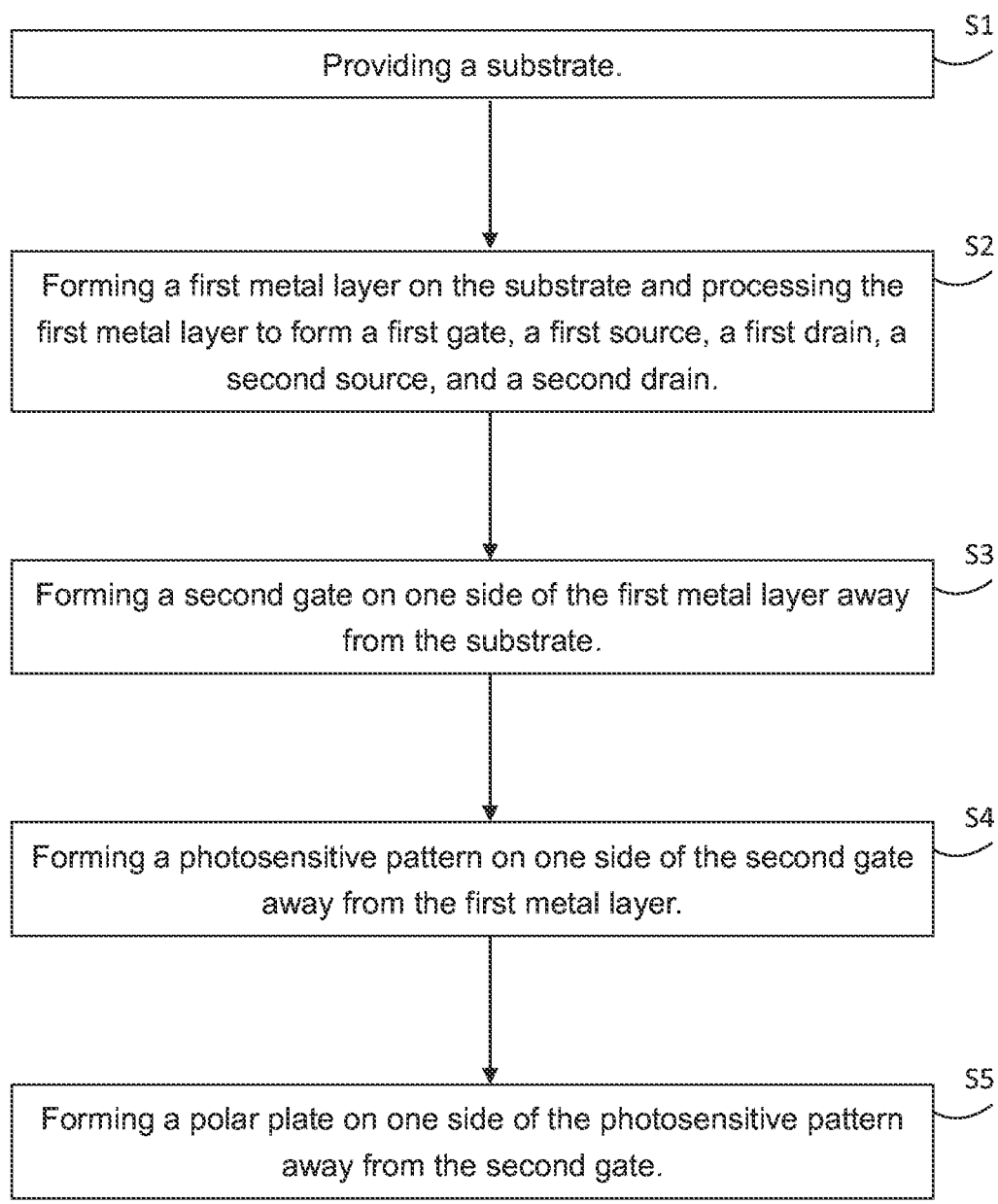
FIG. 5 is a first flowchart of a manufacturing method of a display panel according to embodiments of the present application.

As shown in FIG. 5, embodiments of the present application provide a manufacturing method of a display panel that includes:

S1, providing a substrate;

S2, forming a first metal layer on the substrate and processing the first metal layer to form a first gate, a first source, a first drain, a second source, and a second drain;

S3, forming a second gate on one side of the first metal layer away from the substrate;

S4, forming a photosensitive pattern on one side of the second gate away from the first metal layer; and S5, forming a polar plate on one side of the photosensitive pattern away from the second gate; wherein the first gate, the first source, the second gate, and the active pattern form a first thin film transistor, and the second gate, the photosensitive pattern, and the polar plate form a capacitor.

Embodiments of the present application provide the manufacturing method of the display panel. Through a configuration of the capacitor in the display panel manufactured by the manufacturing method of the display panel, where the capacitor is connected to the first thin film transistor, the photosensitive pattern in the capacitor senses light, such that when the light varies, a varying charge quantity of the photosensitive pattern in the capacitor varies current of the first thin film transistor. A sensitometric characteristic of the photosensitive pattern is better than a sensitometric characteristic of an active pattern of a thin film transistor, thereby increasing a sensitometric characteristic of the first thin film transistor, and increasing fingerprint recognition effect, and the second gate is configured to be a capacitor polar plate, decreasing a thickness of the array substrate.

Figure 6:
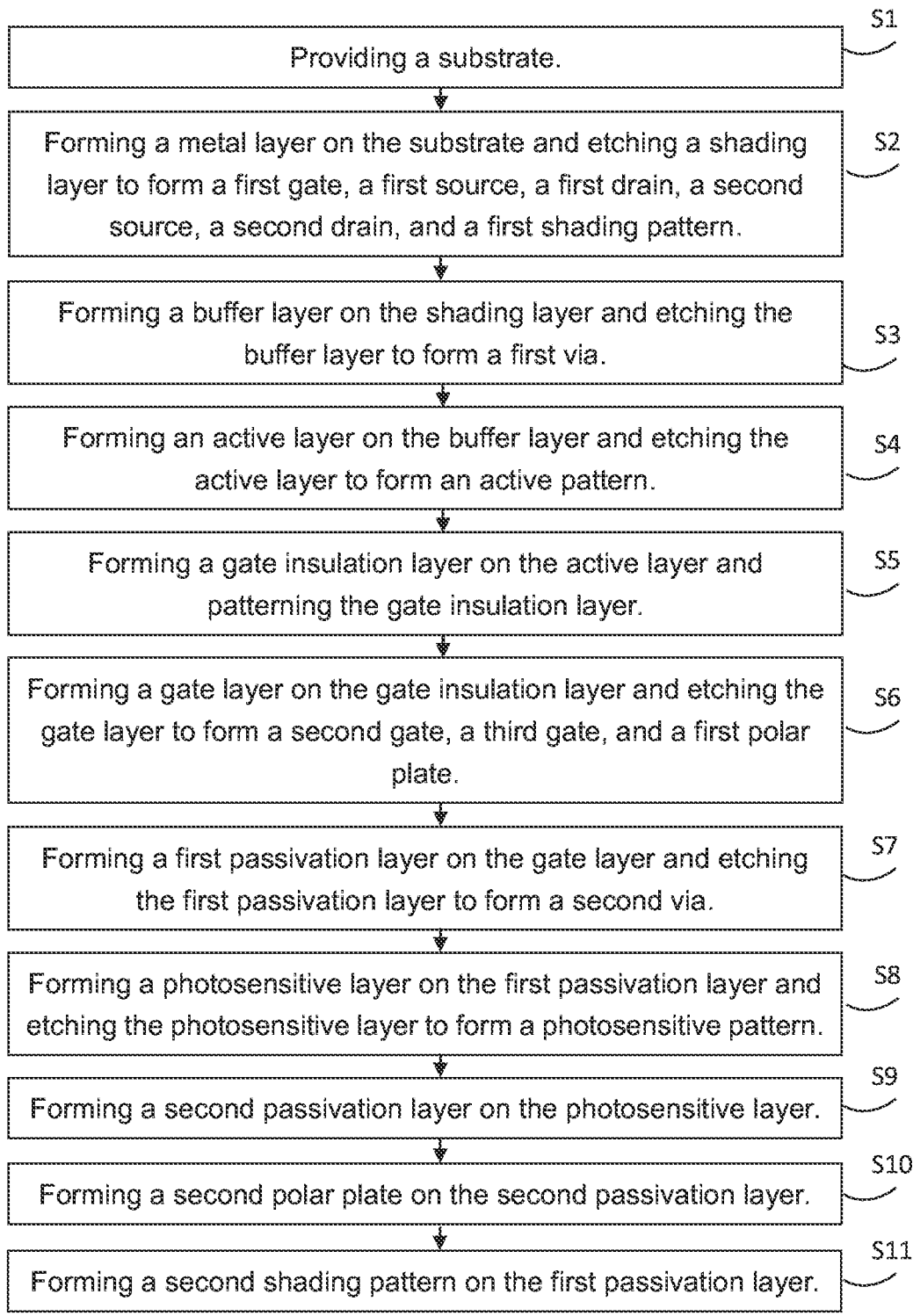
FIG. 6 is a second flowchart of the manufacturing method of the display panel according to embodiments of the present application.
Figure 7A:
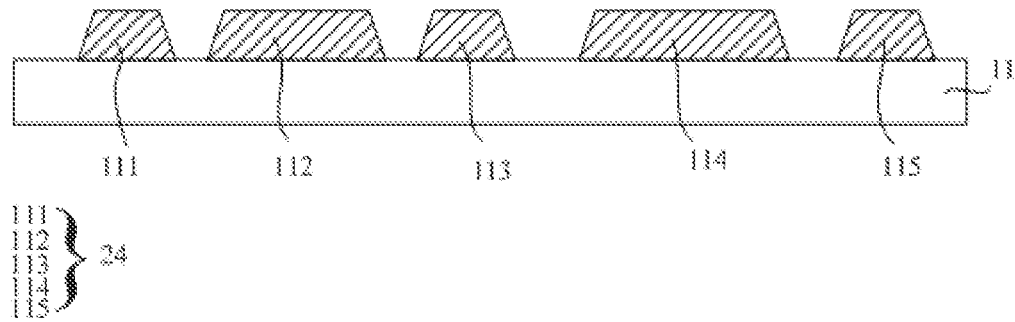
FIG. 7 is a first schematic diagram of the display panel corresponding to steps of the manufacturing method of the display panel according to embodiments of the present application.
Figure 7B:
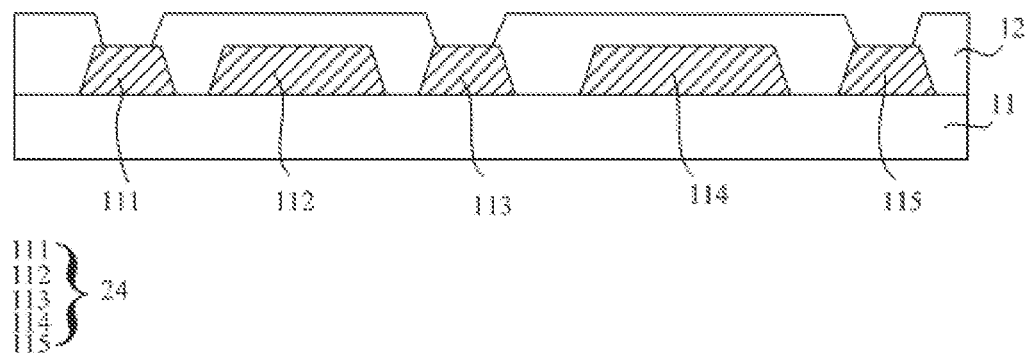
Figure 8A:
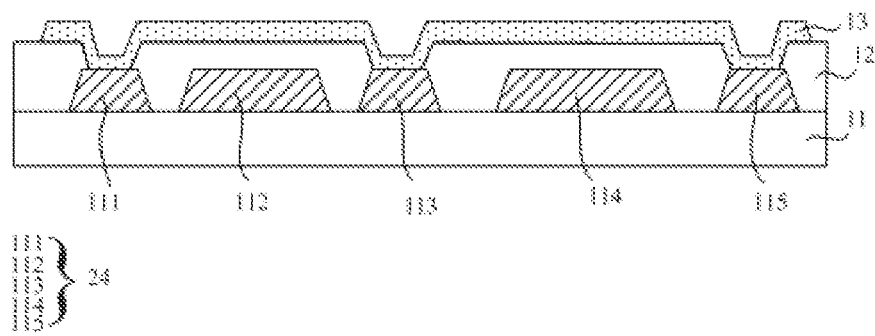
FIG. 8 is a second schematic diagram of the display panel corresponding to steps of the manufacturing method of the display panel according to embodiments of the present application.
Figure 8B:
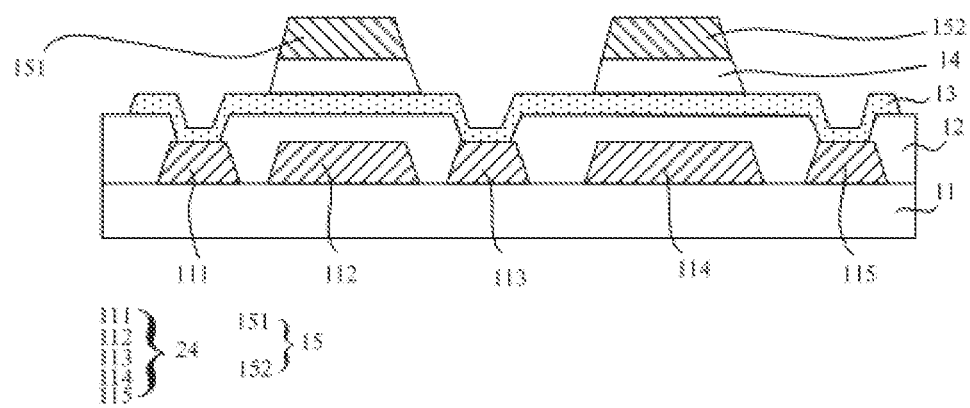
Figure 9A:
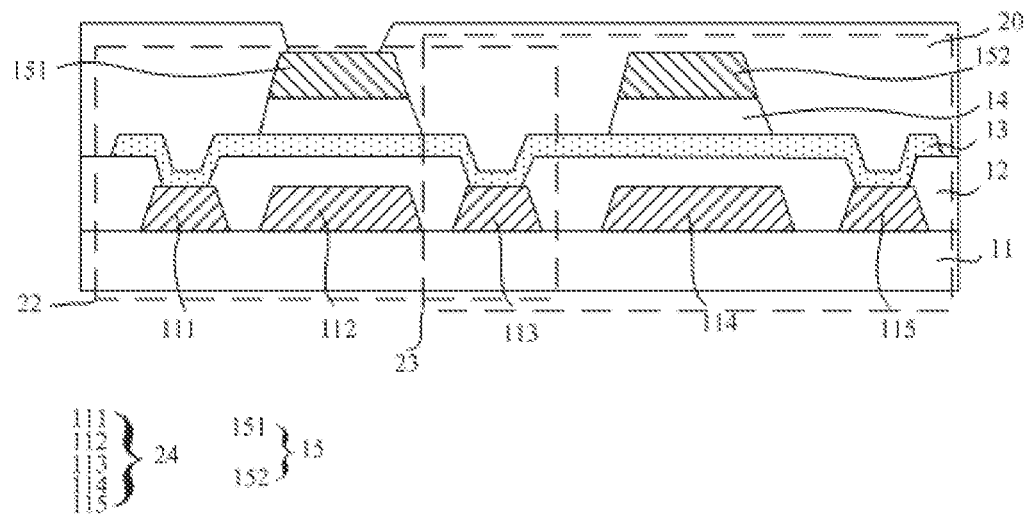
FIG. 9 is a third schematic diagram of the display panel corresponding to steps of the manufacturing method of the display panel according to embodiments of the present application.
Figure 9B:
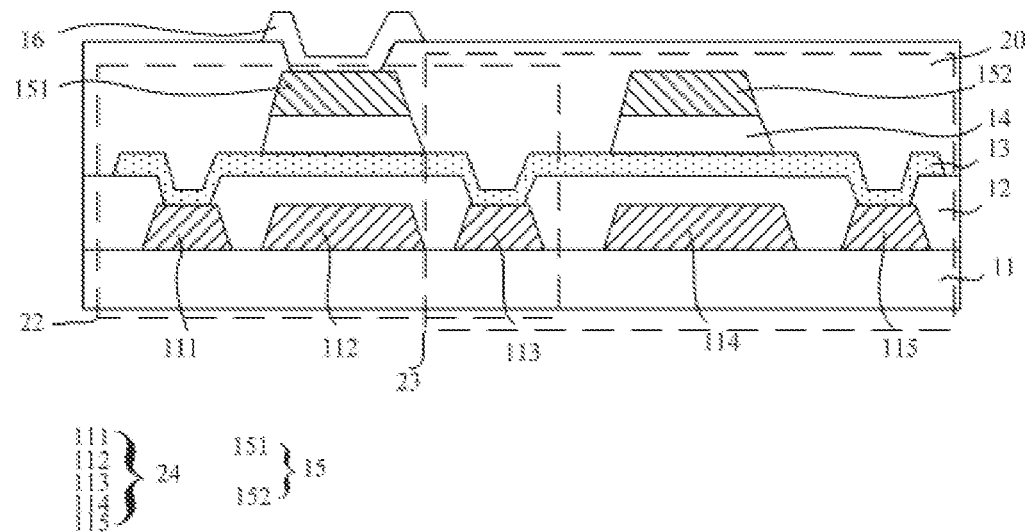
Figure 10A:
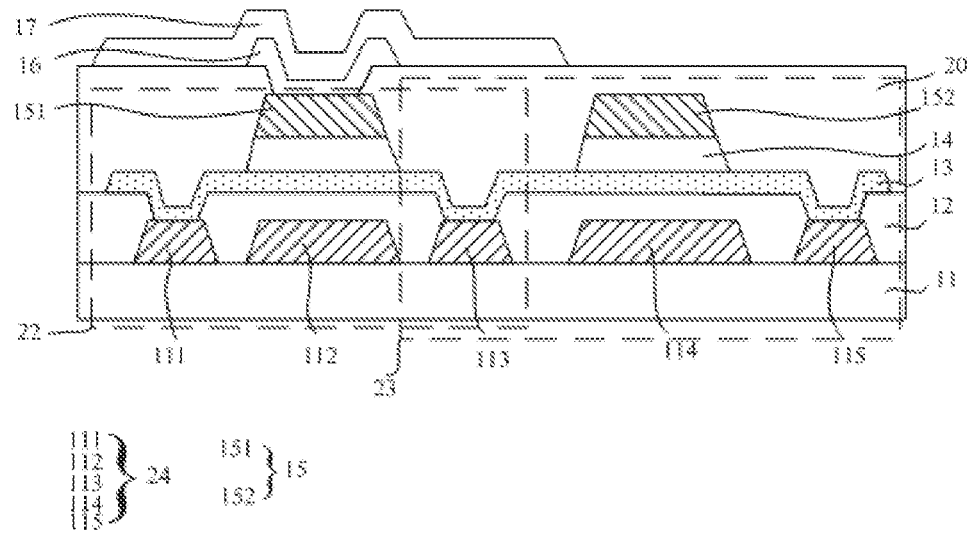
FIG. 10 is a fourth schematic diagram of the display panel corresponding to steps of the manufacturing method of the display panel according to embodiments of the present application.
Figure 10B:
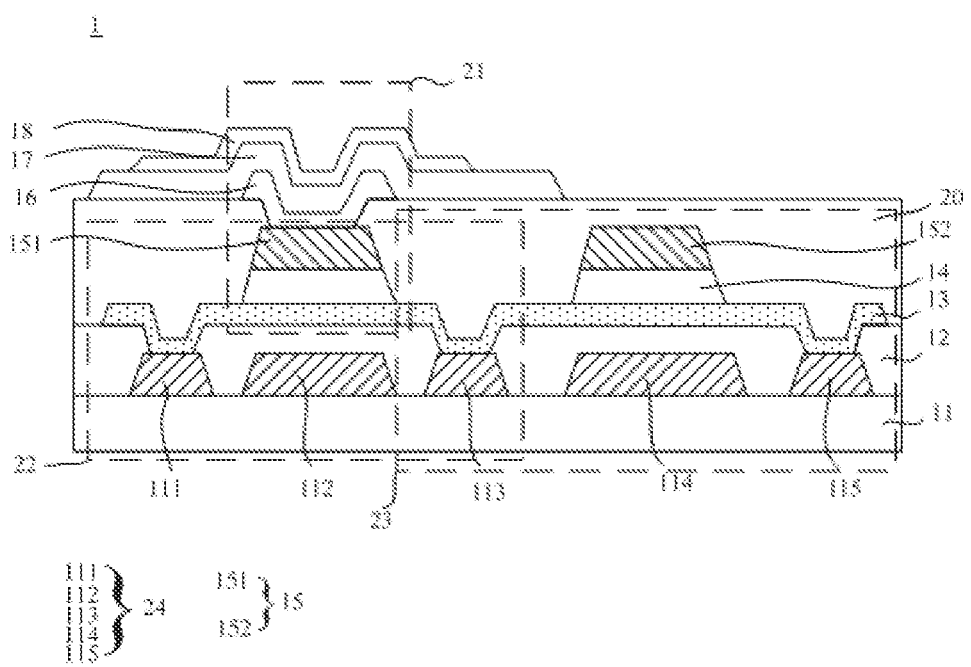

As shown in FIG. 6, embodiments of the present application provide a manufacturing method of a display panel that includes:

S1, providing a substrate; a structure of the display panel corresponding to this step is shown in FIG. 7(a);

S2, forming a metal layer on the substrate and etching a shading layer to form a first gate, a first source, a first drain, a second source, a second drain, and a first shading pattern; a structure of the display panel corresponding to this step is shown in FIG. 7(a);

S3, forming a buffer layer on the shading layer and etching the buffer layer to form a first via; a structure of the display panel corresponding to this step is shown in FIG. 7(b);

S4, forming an active layer on the buffer layer and etching the active layer to form an active pattern, wherein the active layer is filled into the first via; a structure of the display panel corresponding to this step is shown in FIG. 8(a);

S5, forming a gate insulation layer on the active layer and patterning the gate insulation layer; a structure of the display panel corresponding to this step is shown in FIG. 8(b);

S6, forming a gate layer on the gate insulation layer and etching the gate layer to form a second gate, a third gate, and a first polar plate, wherein a first thin film transistor includes the first gate, the second gate, the first source, and the first drain, and the second thin film transistor includes the third gate, the second source, and the second drain; a structure of the display panel corresponding to this step is shown in FIG. 8(b);

S7, forming a first passivation layer on the gate layer and etching the first passivation layer to form a second via; a structure of the display panel corresponding to this step is shown in FIG. 9(a);

S8, forming a photosensitive layer on the first passivation layer and etching the photosensitive layer to form a photosensitive pattern, wherein the photosensitive pattern is filled into the second via; a structure of the display panel corresponding to this step is shown in FIG. 9(b);

S9, forming a second passivation layer on the photosensitive layer; a structure of the display panel corresponding to this step is shown in FIG. 10(a);

S10, forming a second polar plate on the second passivation layer, wherein a capacitor includes the first polar plate, the second polar plate, and the photosensitive pattern located between the first polar plate and the second polar plate, and a sensitivity range of the photosensitive pattern is wider than a sensitivity range of the active pattern of the first thin film transistor; a structure of the display panel corresponding to this step is shown in FIG. 10(b);

S11, forming a second shading pattern on the first passivation layer, wherein the second shading pattern is disposed corresponding to the second thin film transistor. A final structure of the display panel is shown in FIG. 1.

In one embodiment, the step of forming the buffer layer on the metal layer and etching the buffer layer to form the first via includes: annealing the buffer layer under 300 to 400 degrees Celsius for two to three hours.

Figure 11:
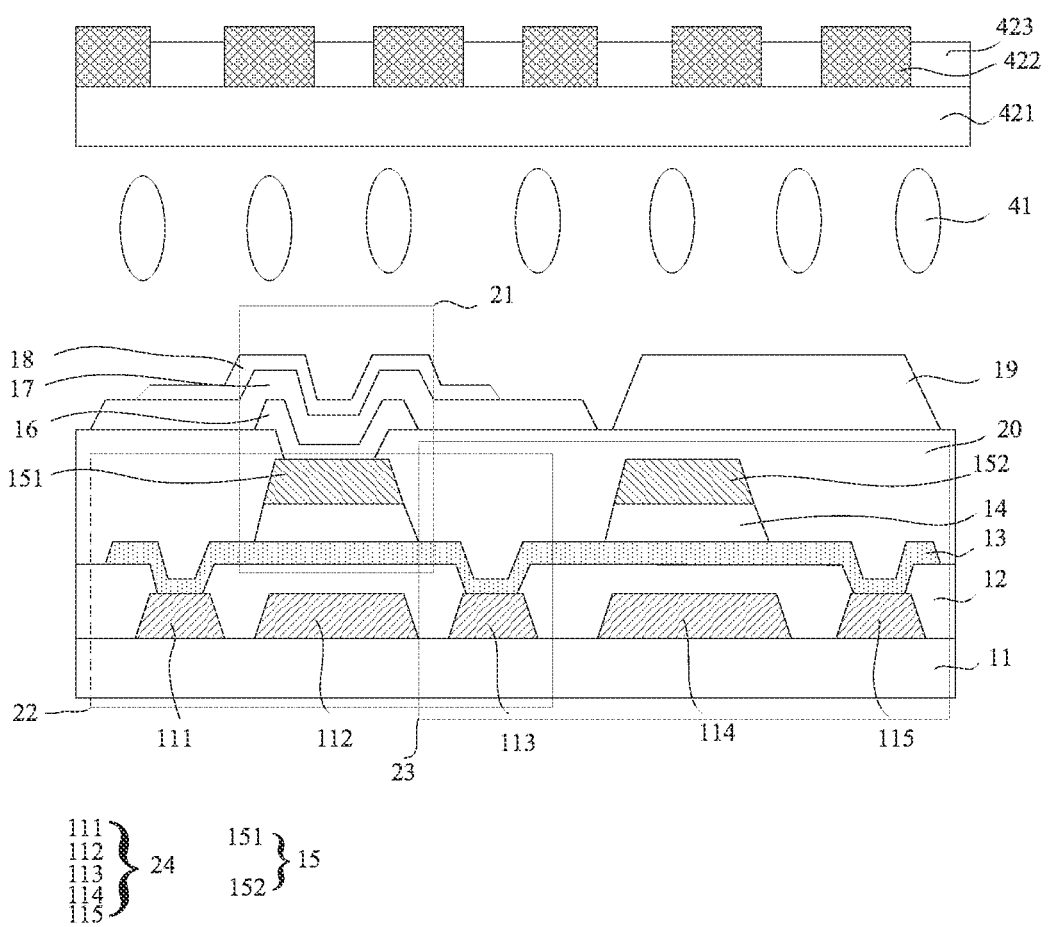
FIG. 11 is a schematic diagram of a display device according to embodiments of the present application.

Meanwhile, as shown in FIG. 11, embodiments of the present application provide a display device that includes a display panel and electronic components, the display panel includes an array substrate, and the array substrate includes:

A substrate 11;

A first gate 112 disposed on one side of the substrate 11;

An active pattern 13 disposed on one side of the first gate 112 away from the substrate 11;

A second gate 151 disposed on one side of the active pattern 13 away from the first gate 112;

A photosensitive pattern 16 disposed on one side of the second gate 151 away from the active pattern 13; and A polar plate 181 disposed on one side of the photosensitive pattern 16 away from the second gate 151;

Wherein, the array substrate further includes a first source 111 and a first drain 113, the first gate 112, the first source 111, the first drain 113, the second gate 151, and the active pattern 13 form a first thin film transistor 22, and the second gate 151, the photosensitive pattern 16, and the polar plate 181 form a capacitor 21.

Embodiments of the present application provide the display device that includes the display panel, and the display panel includes the array substrate. Through a configuration of the capacitor in the array substrate, where the capacitor is connected to the first thin film transistor, the photosensitive pattern in the capacitor senses light, such that when the light varies, a varying charge quantity of the photosensitive pattern in the capacitor varies current of the first thin film transistor. A sensitometric characteristic of the photosensitive pattern is better than a sensitometric characteristic of an active pattern of a thin film transistor, thereby increasing a sensitometric characteristic of the first thin film transistor, and increasing fingerprint recognition effect, and the second gate is configured to be a capacitor polar plate, decreasing a thickness of the array substrate.

In one embodiment, the electronic components include an under-screen camera.

In one embodiment, the display panel includes a liquid crystal display panel. As shown in FIG. 11, the liquid crystal display panel further includes a liquid crystal layer 41, a common electrode layer 421, a color resist layer 422, and a black matrix layer 423.

In one embodiment, the display panel includes an organic light-emitting diode (OLED) display panel.

In one embodiment, in the display device, the first gate is disposed in a same layer as the first source, the first gate is disposed insulated from the first source, the first gate is disposed in the same layer as the first drain, and the first gate is disposed insulated from the first drain.

In one embodiment, in the display device, the array substrate further includes a second source, a third gate, and a first shading pattern. The second source, the first drain, the third gate, and the active pattern form a second thin film transistor, the first shading pattern is disposed corresponding to the active pattern of the second thin film transistor, the first shading pattern is disposed in a same layer as the first gate, the first source, and the first drain, and the first shading pattern is disposed insulated from the first gate, the first source, and the first drain.

In one embodiment, in the display device, the array substrate further includes a pixel electrode layer disposed on one side of the photosensitive pattern away from the second gate, the pixel electrode layer includes a pixel electrode and a polar plate, and the polar plate is insulated from the pixel electrode.

In one embodiment, in the display device, the array substrate further includes a transparent conductive layer and a pixel electrode layer, the transparent conductive layer is disposed between the pixel electrode layer and the photosensitive pattern, the transparent conductive layer forms a polar plate, and the polar plate is disposed insulated from the pixel electrode layer.

In one embodiment, in the display device, the array substrate further includes a second shading pattern correspondingly disposed on the second thin film transistor.

In one embodiment, in the display device, the second gate is disposed in a same layer as the third gate.

It can be understood according to above embodiments:

Embodiments of the present application provide a display panel, a manufacturing method thereof, and a display device. The display panel includes an array substrate, and the array substrate includes a substrate, a first gate, an active pattern, a second gate, a photosensitive pattern, and a polar plate. The first gate is disposed on one side of the substrate, the active pattern is disposed on one side of the first gate away from the substrate, the second gate is disposed on one side of the active pattern away from the first gate, the photosensitive pattern is disposed on one side of the second gate away from the active pattern, and the polar plate is disposed on one side of the photosensitive pattern away from the second gate, wherein the array substrate further includes a first source and a first drain, the first gate, the first source, the first drain, the second gate, and the active pattern form a first thin film transistor, and the second gate, the photosensitive pattern, and the polar plate form a capacitor. In the present application, through a configuration of the capacitor in the array substrate, where the capacitor is connected to the first thin film transistor, the photosensitive pattern in the capacitor senses light, such that when the light varies, a varying charge quantity of the photosensitive pattern in the capacitor varies current of the first thin film transistor. A sensitometric characteristic of the photosensitive pattern is better than a sensitometric characteristic of an active pattern of a thin film transistor, thereby increasing a sensitometric characteristic of the first thin film transistor, and increasing fingerprint recognition effect, and the second gate is configured to be a capacitor polar plate, decreasing a thickness of the array substrate.

In the above-described embodiments, description for each embodiment has its emphasis. When there is insufficient description in one embodiment, one can refer to other embodiments for relative description.

Although the present application has been explained in relation to its preferred embodiment, it does not intend to limit the present application. It will be apparent to those skilled in the art having regard to this present application that other modifications of the exemplary embodiments beyond these embodiments specifically described here may be made without departing from the spirit of the application. Accordingly, such modifications are considered within the scope of the application as limited solely by the appended claims.

What is claimed is:

1. A display panel, comprising an array substrate, wherein the array substrate comprises:

a substrate;

a first gate disposed on one side of the substrate;

an active pattern disposed on one side of the first gate away from the substrate;

a second gate disposed on one side of the active pattern away from the first gate;

a photosensitive pattern disposed on one side of the second gate away from the active pattern; and a polar plate disposed on one side of the photosensitive pattern away from the second gate;

wherein the array substrate further comprises a first source and a first drain, the first gate, the first source, the first drain, the second gate, and the active pattern form a first thin film transistor, and the second gate, the photosensitive pattern, and the polar plate form a capacitor.

2. The display panel as claimed in claim 1, wherein the first gate is disposed in a same layer as the first source, the first gate is disposed insulated from the first source, the first gate is disposed in the same layer as the first drain, and the first gate is disposed insulated from the first drain.

3. The display panel as claimed in claim 2, wherein the array substrate comprises a second source, a third gate, and a first shading pattern, the second source, the first drain, the third gate, and the active pattern form a second thin film transistor, the first shading pattern is disposed corresponding to the active pattern of the second thin film transistor, the first shading pattern is disposed in the same layer as the first gate, the first source, and the first drain, and the first shading pattern is disposed insulated from the first gate, the first source, and the first drain.

4. The display panel as claimed in claim 3, wherein the array substrate comprises a pixel electrode layer disposed on one side of the photosensitive pattern away from the second gate, the pixel electrode layer comprises a pixel electrode and a polar plate, and the polar plate is insulated from the pixel electrode.

5. The display panel as claimed in claim 3, wherein the array substrate comprises a transparent conductive layer and a pixel electrode layer, the transparent conductive layer is disposed between the pixel electrode layer and the photosensitive pattern, the transparent conductive layer forms a polar plate, and the polar plate is disposed insulated from the pixel electrode layer.

6. The display panel as claimed in claim 3, wherein the array substrate comprises a second shading pattern correspondingly disposed on the second thin film transistor.

7. The display panel as claimed in claim 3, wherein the second gate is disposed in a same layer as the third gate.

8. The display panel as claimed in claim 1, wherein a material of the photosensitive pattern comprises at least one of amorphous silicon or thiophene organic materials.

9. The display panel as claimed in claim 1, wherein the array substrate comprises:
 a shading layer disposed on one side of the substrate and forming a first shading pattern;
 a buffer layer disposed on one side of the shading layer away from the substrate; and
 a metal layer forming the first gate, the first source, and the first drain.

10. The display panel as claimed in claim 1, wherein the array substrate comprises:
 a shading layer disposed on one side of the substrate and forming a first shading pattern;
 a buffer layer disposed on one side of the shading layer away from the substrate;
 a first metal layer disposed on one side of the buffer layer away from the shading layer;
 a first gate insulation layer disposed on one side of the first metal layer away from the buffer layer;
 an active layer disposed on one side of the first gate insulation layer away from the first metal layer;
 a second gate insulation layer disposed on one side of the active layer away from the first metal layer; and
 a second metal layer disposed on one side of the second gate insulation layer away from the active layer and forming the second gate;
 wherein the first metal layer forms the first gate, the first source, and the first drain.

11. A display device, comprising a display panel and electronic components, wherein the display panel comprises an array substrate, and the array substrate comprises:
 a substrate;
 a first gate disposed on one side of the substrate;
 an active pattern disposed on one side of the first gate away from the substrate;
 a second gate disposed on one side of the active pattern away from the first gate;
 a photosensitive pattern disposed on one side of the second gate away from the active pattern; and
 a polar plate disposed on one side of the photosensitive pattern away from the second gate;
 wherein the array substrate further comprises a first source and a first drain, the first gate, the first source, the first drain, the second gate, and the active pattern form a first thin film transistor, and the second gate, the photosensitive pattern, and the polar plate form a capacitor.

12. The display device as claimed in claim 11, wherein the electronic components comprise an under-screen camera.

13. The display device as claimed in claim 11, wherein the display panel comprises a liquid crystal display panel or an organic light-emitting diode (OLED) display panel.

14. The display device as claimed in claim 11, wherein the first gate is disposed in a same layer as the first source, the first gate is disposed insulated from the first source, the first gate is disposed in the same layer as the first drain, and the first gate is disposed insulated from the first drain.

15. The display device as claimed in claim 14, wherein the array substrate comprises a second source, a third gate, and a first shading pattern, the second source, the first drain, the third gate, and the active pattern form a second thin film transistor, the first shading pattern is disposed corresponding to the active pattern of the second thin film transistor, the first shading pattern is disposed in the same layer as the first gate, the first source, and the first drain, and the first shading pattern is disposed insulated from the first gate, the first source, and the first drain.

16. The display device as claimed in claim 15, wherein the array substrate comprises a pixel electrode layer disposed on one side of the photosensitive pattern away from the second gate, the pixel electrode layer comprises a pixel electrode and a polar plate, and the polar plate is insulated from the pixel electrode.

17. The display device as claimed in claim 15, wherein the array substrate comprises a transparent conductive layer and a pixel electrode layer, the transparent conductive layer is disposed between the pixel electrode layer and the photosensitive pattern, the transparent conductive layer forms a polar plate, and the polar plate is disposed insulated from the pixel electrode layer.

18. The display device as claimed in claim 15, wherein the array substrate comprises a second shading pattern correspondingly disposed on the second thin film transistor.

19. The display device as claimed in claim 15, wherein the second gate is disposed in a same layer as the third gate.

20. A manufacturing method of a display panel, comprising:
 providing a substrate;

forming a first metal layer on the substrate and processing the first metal layer to form a first gate, a first source, a first drain, a second source, and a second drain;

forming a second gate on one side of the first metal layer away from the substrate;

forming a photosensitive pattern on one side of the second gate away from the first metal layer; and forming a polar plate on one side of the photosensitive pattern away from the second gate; wherein the first gate, the first source, the second gate, and an active pattern form a first thin film transistor, and the second gate, the photosensitive pattern, and the polar plate form a capacitor.

* * * * *